April 2, 1974 R. S. RONEN ET AL 3,801,477

METHOD OF DEPOSITING ELECTRODE LEADS

Filed June 23, 1972 4 Sheets-Sheet 1

United States Patent Office 3,801,477

Patented Apr. 2, 1974

3,801,477

METHOD OF DEPOSITING ELECTRODE LEADS

Ram Shaul Ronen, Kendall Park, and Edward Anthony James, Skillman, N.J., assignors to RCA Corporation Filed June 23, 1972, Ser. No. 265,550
Int. Cl. B44d *1/18*; C23b *5/48*; H01l *1/14*
U.S. Cl. 204—15 6 Claims

ABSTRACT OF THE DISCLOSURE

Method of making an electrical lead connection to the top surface of a passivation coated semiconductor device chip mounted on a substrate, where the lead is a conducting metal path extending across the substrate and over an edge of the chip, comprising depositing a first thin, electrically conductive layer of metal over both substrate and coated chip, covering the first layer of metal with a thick layer of photoresist, removing portions of photoresist layer conforming to the desired shape of the lead, electrodepositing a thick layer of metal where the photoresist has been removed, covering the thick layer of metal with a layer of a material which is resistant to a particular solvent for the first metal layer, and treating the chip and substrate with the solvent to remove that part of the first metal layer not covered by the resistant material.

BACKGROUND OF THE INVENTION

In certain applications, such as some hybrid integrated circuits, semiconductor device chips are mounted, face up, on an insulating substrate which may have a pattern of conductors and passive circuit elements thereon. Electrical connections must be made between locations on the substrate and one or more electrodes on the top surfaces of the chips. Although these connections can be made with soldered bridging wires, the making of such connections is time-consuming and expensive. A method is required which can be applied to many leads at the same time.

In the past, evaporation has been resorted to in order to deposit ribbon type leads connecting device chip electrodes with bonding pads on a substrate. However, running the lead over an edge of the chip without a break is a serious problem since deposition of metal on the vertical chip wall is often incomplete and inadequate. When metal deposition is non-uniform, and too thin, high resistance portions are formed and the device may operate either improperly or not at all.

A similar problem of making connections to device electrodes exists in the case of mesa type transistors. In this type of transistor, usually both emitter and base electrodes are disposed at a high level relative to their surroundings and it is difficult to run ribbon type deposited leads to these electrodes.

THE DRAWING

DESCRIPTION OF PREFERRED EMBODIMENT

The method of the invention will be explained in connection with making a diode mounted on an insulating substrate. However, it will be understood that the method can be applied to any device with surfaces at two different levels and in which a deposited metal layer is run over a substantially vertical wall between the two levels.

Figure 1:
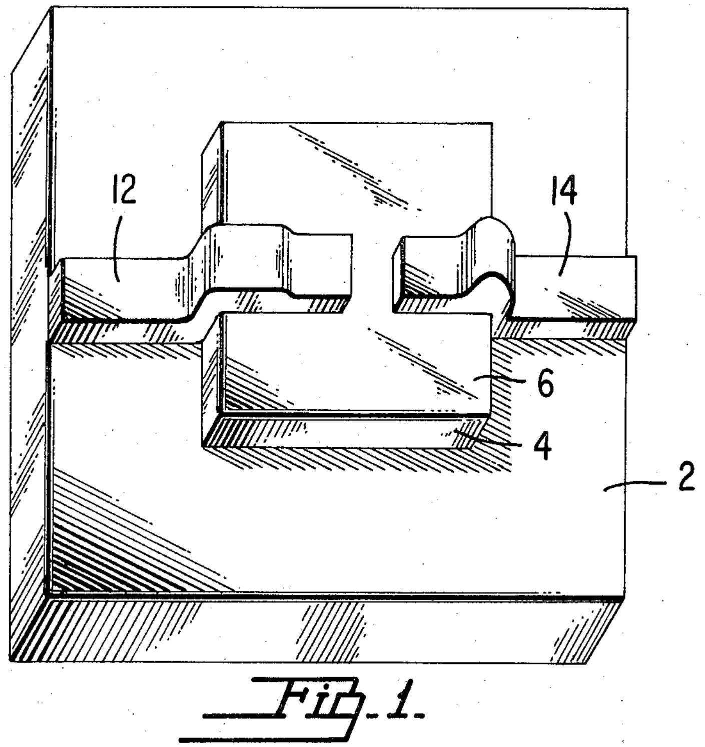
FIG. 1 is a perspective view of a semiconductor device with leads made in accordince with the present invention.
Figure 3:
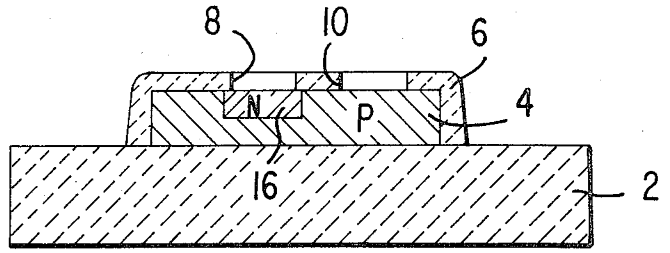
FIG. 3 is a section view along the line 3—3 of FIG. 2.

As shown in FIG. 1, a semiconductor device comprises an insulating substrate 2, which may be a ceramic plate having a semiconductor chip 4 adhered thereto. The top surface and the sides of the chip 4 have a passivating coating 6 of silicon dioxide disposed thereon. The coating 6 has openings 8 and 10 therein (FIG. 3) where electrode connections are to be made to chip 4. The device also includes electrode leads 12 and 14 making contact to the chip 4 through the openings 8 and 10, respectively. These leads are adhered to the substrate 2 and extend up over the sides of the chip on top of the silicon dioxide coating 6.

Figure 2:
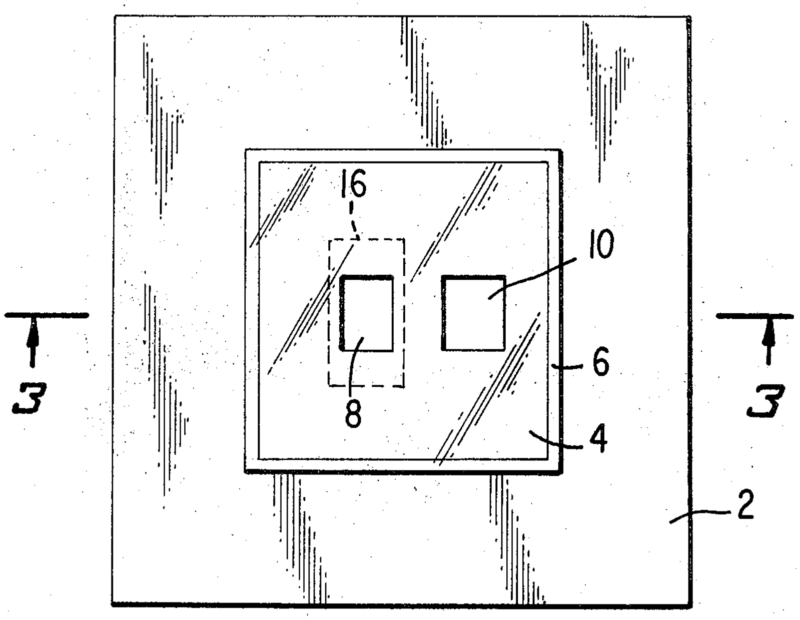
FIG. 2 is a top plan view illustrating an early stage in making the device of FIG. 1.

In making the leads 12 and 14 (FIGS. 2 and 3), one may start with a semiconducting silicon device chip 4 mounted on a ceramic substrate 2. Alternatively, the semiconducting materials may be germanium or a III–V compound or any other known semiconductor. The chip may be P type, for example, and have a diffused region 16 of N type extending to the top surface of the chip. The chip 2 is also provided with an electrically insulating passivation coating 6 of silicon dioxide having an opening 8 exposing the surface of N type region 16 and another opening 10 exposing part of the P type body 4. Alternatively, the passivation coating may be another well known material such as silicon nitride, aluminum oxide or an organic material.

Figure 4:
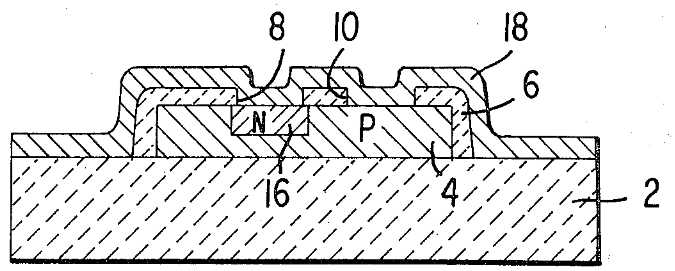
FIG. 4 is a section view illustrating a method stage following that of FIGS. 2 and 3.

As shown in FIG. 4, a thin, electrically conductive coating 18 about 2,000–5,000 A. thick, of a metal such as aluminum, is deposited, as by evaporation, over the entire top surface of the substrate 2, over the entire silicon dioxide coating 6 and into the openings 8 and 10. The aluminum coating 18 may not be completely continuous over the sides of the chip but this will not matter in the present method.

Figure 6:
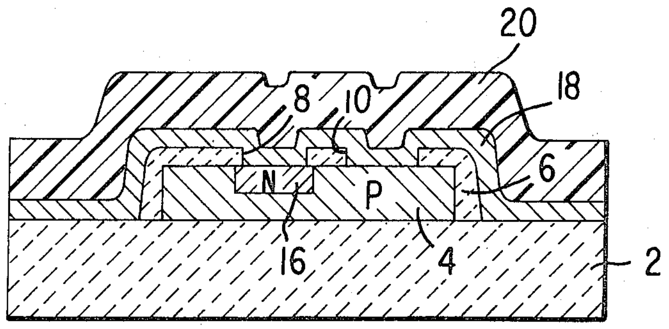
FIG. 6 is a section view taken along the line 6—6 of FIG. 5.
Figure 5:
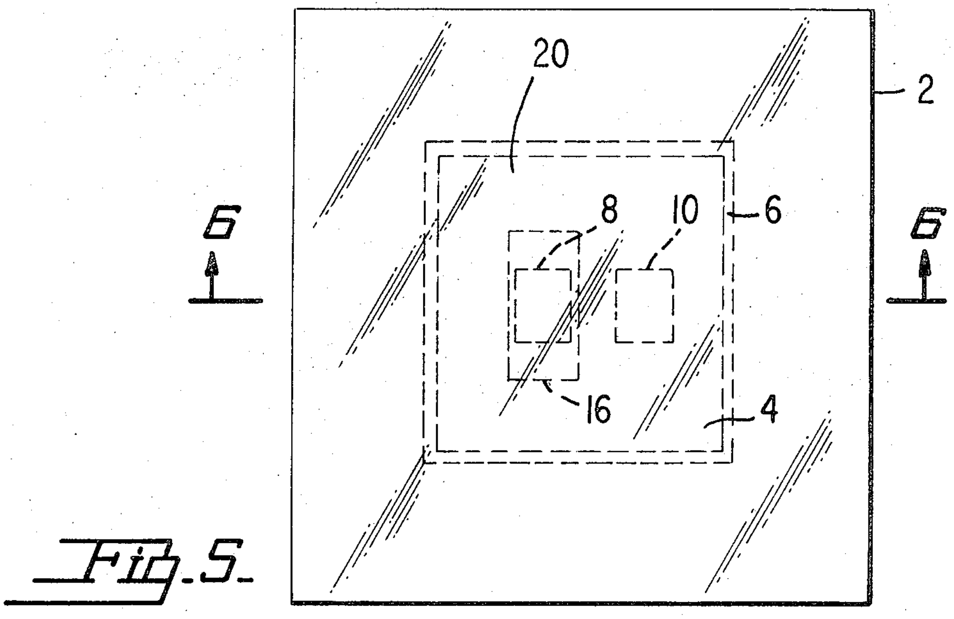
FIG. 5 is a plan view illustrating a method stage following that of FIG. 4.

Next (FIGS. 5 and 6), a thick coating of photoresist 20, which may be at least 0.5 micron thick and preferably is 10 microns or more thick is deposited over the entire upper surface of the substrate 2 and chip 4. The photoresist covers the entire metal layer 18.

Figures 7, 8, 9:
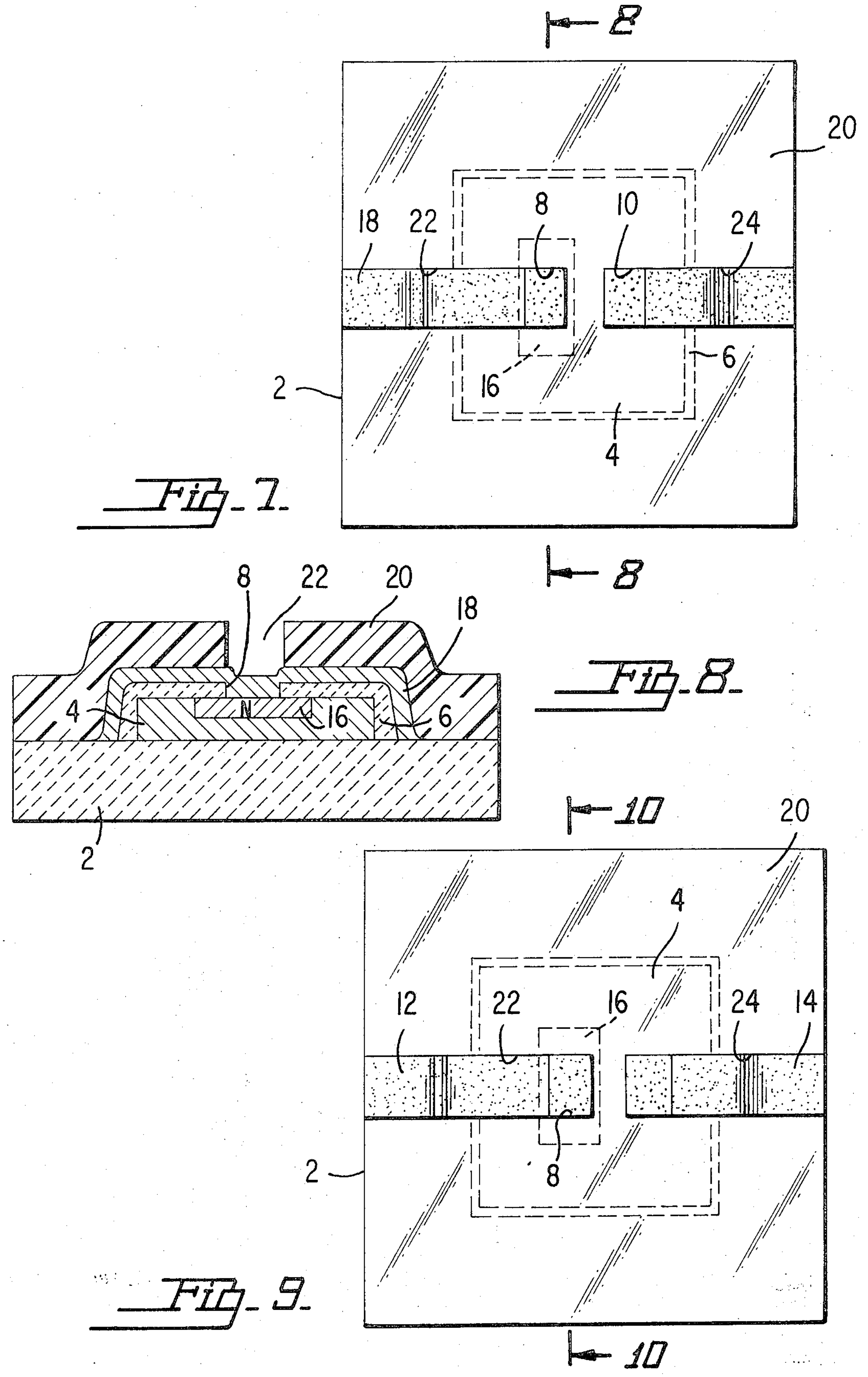
FIG. 7 is a plan view illustrating a method stage following that of FIGS. 5 and 6.
FIG. 8 is a section view taken along the line 8—8 of FIG. 7.
FIG. 9 is a plan view illustrating a method stage following that of FIGS. 7 and 8.

Then, by conventional masking and developing techniques (FIGS. 7 and 8), openings 22 and 24 are formed in the photoresist layer 20. These openings each has a shape corresponding to one of the leads to be deposited. Opening 22 is a slot extending from opening 8 in the silicon dioxide layer 6, to an edge of substrate 2. Opening 24 is a slot extending from opening 10 in silicon dioxide layer 6 to a different edge of substrate 2.

Figure 10:
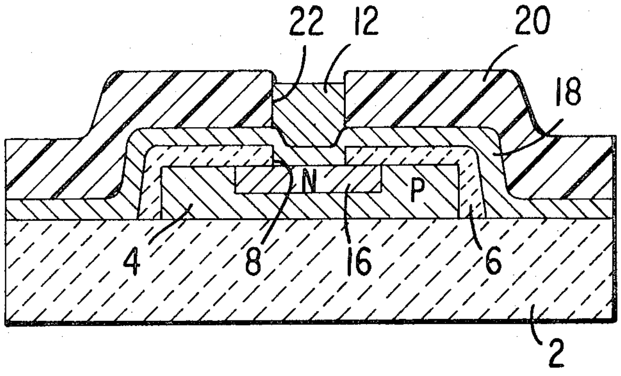
FIG. 10 is a section view taken along the line 10—10 of FIG. 9.

Next (FIGS. 9 and 10), a thick composite layer of metal 12, which may be copper topped with gold or other solvent-resistant material such as palladium, platinum or ruthenium, is deposited electrolytically within the opening 22 in the photoresist layer 20 and a similar metal layer 14 is deposited within opening 24. The metal layers 12 and 14 may be nearly as thick as the photoresist layer 20. The first deposited metal layer 18 serves as cathode in the electrodeposition of metal layers 12 and 14.

Figure 11:
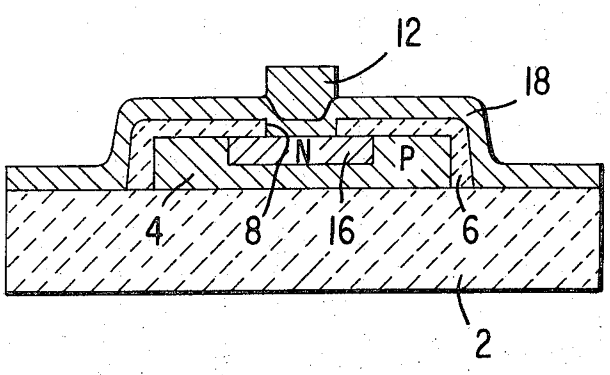
FIG. 11 is a section view illustrating a method stage following that of FIGS. 9 and 10.

The next step (FIG. 11) is to dissolve off all of the remaining photoresist layer 20, which exposes the aluminum layer 18 that is not covered by the deposited leads 12 and 14.

Figure 12:
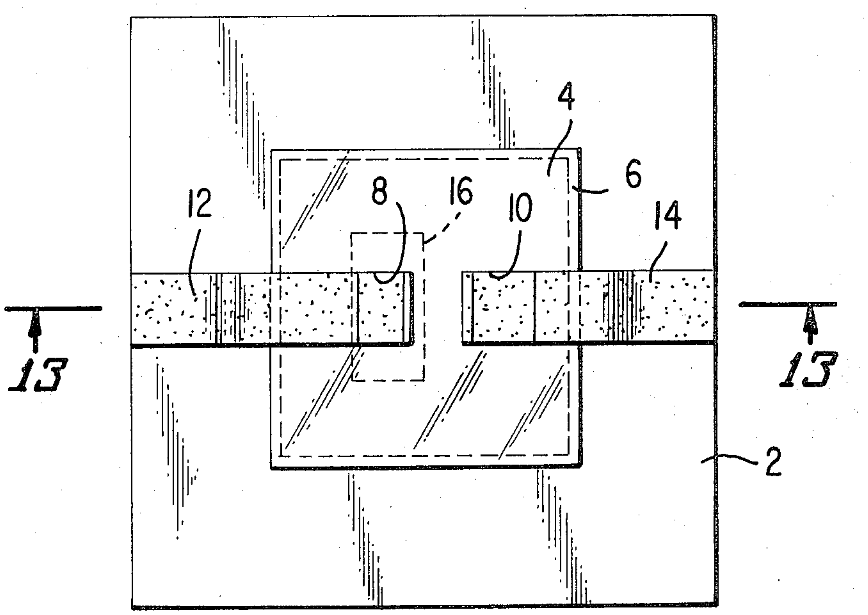
FIG. 12 is a plan view illustrating a method stage following that of FIG. 11.
Figure 13:
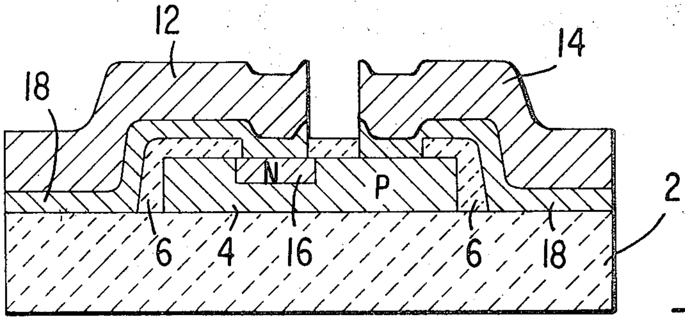
FIG. 13 is a section view taken along the line 13—13 of FIG. 12.

Then (FIGS. 12 and 13), the exposed portion of aluminum layer 18 is removed by etching with an etchant that does not dissolve gold. The gold layer which is the top portion of the metal layers 12 and 14 serves as a resist to prevent attack of the layers 12 and 14 when metal layer 18 is being removed.

The electrodeposited metal layers 12 and 14 are of such nature that the metal fills in or bridges across any gaps which may be present in the underlying aluminum layer 18. When a metal is electrodeposited it tends to grow laterally from nuclei or islands that are first deposited, until a continuous layer is formed. Thus, the leads 12 and 14 are continuous over the edge of the chip 4.

It sometimes happens, also, that the insulating layer 6 may be incomplete around the edges of the chip 4. In the present method, most gaps in the insulating layer are bridged over and the metal layers 12 and 14 do not contain gaps.

The bottom portions of metal layers 12 and 14 may be made of any metal that can be electrodeposited. For example, it may be desired to deposit leads that have magnetic properties. If this is the case, nickel or iron or any alloy of the two may be deposited in place of the copper. If the lead is to have resistance properties, chromium may be deposited.

We claim:

1. A method of forming an electrical lead connection to the upper surface of a semiconductor device chip mounted on a substrate and extending outwardly therefrom, comprising:

providing said surface and the edges of said chip with an electrically insulating passivation coating having an opening therein where an electrode connection is to be made to said chip, depositing a first thin, electrically conductive layer of an adherent metal over said substrate and over said passivation coating and including the surface of said chip within said opening, covering said first thin layer of metal with a layer of resist, removing portions of said resist on said substrate and on said chip conforming to the desired shape of said lead, and electro-depositing a second layer of a good electrically conducting metal where said resist has been removed.

2. A method according to claim 1 including the additional steps of covering said second layer of metal with a layer of an etchant-resistant material, dissolving the remainder of said resist layer, and removing that portion of said first metal layer not covered by said second metal layer.

3. A method according to claim 1 in which said passivation coating is silicon dioxide.

4. A method according to claim 1 in which said first layer of metal comprises aluminum.

5. A method according to claim 1 in which said second metal layer comprises copper.

6. A method according to claim 2 in which said etchant-resistant material is gold.

References Cited

UNITED STATES PATENTS

| | | | |
|---|---|---|---|
| 3,653,999 | 4/1972 | Fuller | 204—15 |
| 3,620,932 | 11/1971 | Crishal | 204—15 |
| 3,616,282 | 10/1971 | Bodway | 117—212 |

THOMAS M. TUFARIELLO, Primary Examiner

U.S. Cl. X.R.

29—591; 117—212